(12) United States Patent
Lagowski et al.

(10) Patent No.: US 6,512,384 B1
(45) Date of Patent: Jan. 28, 2003

(54) METHOD FOR FAST AND ACCURATE DETERMINATION OF THE MINORITY CARRIER DIFFUSION LENGTH FROM SIMULTANEOUSLY MEASURED SURFACE PHOTOVOLTAGES

(75) Inventors: Jacek Lagowski, Tampa, FL (US); Vladimir Faifer, Moscow (RU); Andrei Aleinikov, Tampa, FL (US)

(73) Assignee: Semiconductor Diagnostics, Inc., Tampa, FL (US)

( * ) Notice: Subject to any disclaimer, the term of this patent is extended or adjusted under 35 U.S.C. 154(b) by 0 days.

(21) Appl. No.: 09/672,351

(22) Filed: Sep. 28, 2000

Related U.S. Application Data

(60) Provisional application No. 60/214,985, filed on Jun. 29, 2000.

(51) Int. Cl.$^7$ .................... G01R 31/302; G01R 31/26
(52) U.S. Cl. ................. 324/752; 324/765; 324/766
(58) Field of Search ................. 324/752, 765, 324/766, 767, 750, 751; 250/214 R, 215; 356/30, 600

(56) References Cited

U.S. PATENT DOCUMENTS

| | | | |
|---|---|---|---|
| 4,333,051 A | 6/1982 | Goodman | 324/158 R |
| 4,393,348 A | 7/1983 | Goldstein et al. | 324/158 R |
| 4,433,288 A | 2/1984 | Moore | 324/158 D |
| 4,567,431 A | 1/1986 | Goodman | 324/158 R |
| 4,581,578 A | 4/1986 | Honma et al. | 324/158 D |
| 4,598,249 A | 7/1986 | Goodman et al. | 324/158 R |
| 4,656,419 A | 4/1987 | Garlick | 324/158 D |
| 4,827,212 A | 5/1989 | Kamieniecki | 324/158 R |
| 4,851,767 A | 7/1989 | Halbout et al. | 324/158 P |
| 4,859,939 A | 8/1989 | Gittleman et al. | 324/158 R |
| 4,891,584 A | 1/1990 | Kamieniecki et al. | 324/158 R |
| 5,025,145 A | 6/1991 | Lagowski | 250/211 J |
| 5,087,876 A | 2/1992 | Reiss et al. | 324/158 D |
| 5,091,691 A | 2/1992 | Kamieniecki et al. | 324/158 R |
| 5,126,660 A | 6/1992 | Harvey et al. | 324/158 R |
| 5,177,351 A | 1/1993 | Lagowski | 250/215 |
| 5,471,293 A | * 11/1995 | Lowell et al. | 356/30 |
| 5,581,194 A | * 12/1996 | Lowell | 324/752 |
| 5,663,657 A | 9/1997 | Lagowski et al. | 324/766 |

FOREIGN PATENT DOCUMENTS

| | | |
|---|---|---|
| JP | 58-96255 | 6/1983 |

OTHER PUBLICATIONS

Choo et al., "Bulk Trapping Effect on Carrier Diffusion Length as Determined by the Surface Photovoltage Method: Theory", *Solid–State Electronics*, 13:609–617, 1970.

Chu et al., "A comparison of carrier lifetime measurements by photoconductive decay and surface photovoltage methods", *J. Appl. Phys.*, 49(5):2996–2997, May, 1978.

Dmitruk et al., "Investigation of Surface Recombination on Expitaxial GaAs Films", *Phys. Stat. Sol.*, (a) 20, 53, 1973.

Goodman, "A Method for the Measurement of Short Minority Carrier Diffusion Lengths in Semiconductors", *Journal of Applied Physics*, 32:2550–2552, Dec., 1961.

(List continued on next page.)

*Primary Examiner*—Michael Sherry
*Assistant Examiner*—Paresh Patel
(74) *Attorney, Agent, or Firm*—Fish & Richardson P.C.

(57) ABSTRACT

Minority carrier diffusion lengths are determined fast, accurately, and conveniently by illuminating a surface of the semiconductor with a beam composed of a plurality of light fluxes each having a different wavelength modulated at a different frequency. Surface photovoltages induced by different light fluxes are simultaneously detected by monitoring surface photovoltage signals at the different modulation frequencies. The surface photovoltage signals are frequency calibrated and then used to calculated a minority carrier diffusion length.

33 Claims, 5 Drawing Sheets

OTHER PUBLICATIONS

Goodman, "Minority Carrier Diffusion Length in Silicon by Measurement of Steady–State Surface Photovoltage", *ASTM Standard*, F–139, 770–775, 1978.

Goodman et al., "Silicon–Wafer Process Evaluation Using Minority–Carrier Diffusion–Length Measuremen by the SPV Method", *RCA Review*, 44:326–341, Jun., 1983.

Kamieniecki, "Surface photovoltage measured capacitance: Application to semiconductor/electrolyte system", *J. Appl. Phys.*, 54(11):6481–6487, Nov. 1983.

Kamieniecki et al., "A New Method for In–Line, Real–Time Monitoring of Wafer Cleaning Operations", *The Symposium on Ultra Clean Processing of Silicon Surfaces, UCPSS '94, Bruges, Belgium*, Sep. 19–21, 1994.

Lagowski et al., "Method for the Measurement of Long Minority Carrier Diffusion Lengths Exceeding Wafer Thickness", *Appl. Phys. Lett.*, 63(21):2902–2904, Nov. 22, 1993.

Luke et al., "A Chemical/Microwave Technique for the Measurement of Bulk Minority Carrier Lifetime in Silicon Wafer", *Journal of the Electrochemical Society*, 135:957–961, Apr., 1988.

Moss, "Photovoltaic and Photoconductive Theory Applied to InSb", *Journal of Electronics and Control*, 1, 126–133, 1955.

Phillips, "Interpretation of Steady–State Surface Photovoltage Measurements in Epitaxial Semiconductor Layers", *Solid–State Electronics*, 15:1097–1102, 1972.

Saritas et al., "Diffusion Length Studies in Silicon by the Surface Photovoltage Method", *Solid–State Electronics*, 31:835–842, May, 1988.

Saritas et al., "Comparison of minority–carrier diffusion length measurements in silicon by the photoconductive decay and surface photovoltage methods", *J. Appl. Phys.*, 63(9):4561–4567, May 1, 1988.

Semiconductor Diagnostics Activity Prior to Sep. 26, 1993.

Verkuil, "A Simple, Low Cost, Non–Contact Method of Measuring Bulk Minority Carrier Diffusion Length", *The Electrochemical Society*, Extended Abstracts from Spring Meeting, May 11–16, 1980, Abstract No. 193.

\* cited by examiner

METHOD FOR FAST AND ACCURATE DETERMINATION OF THE MINORITY CARRIER DIFFUSION LENGTH FROM SIMULTANEOUSLY MEASURED SURFACE PHOTOVOLTAGES

CROSS RELATED APPLICATION

Under 35 USC §119(e)(1), this application claims the benefit of provisional application serial No. 60/214,985, filed Jun. 29, 2000.

FIELD OF INVENTION

This invention relates to determining minority carrier diffusion lengths, and particularly to fast and accurate determination of minority carrier diffusion lengths.

BACKGROUND OF INVENTION

The performance and reliability of semiconductor electronic and optoelectronic devices, and the integrated circuits into which they are incorporated, depends upon the purity of the semiconductor from which the devices are made. In particular, the level of heavy metal contaminants (e.g., Fe, Cr, and other metals) which may be introduced into the semiconductor during manufacturing and processing degrades performance and reduces the manufacturing yield.

One measure of semiconductor contamination is the minority carrier diffusion length, L. This parameter is the effective distance that excess minority carriers diffuse into a semiconductor during their lifetime. The value of minority carrier diffusion length is used as an indicator of the purity of semiconductor materials. L gives a measure of the contaminant concentration in the semiconductor because heavy metals function as recombination centers which reduce the minority carrier lifetime. As a result, higher concentrations of contaminants decrease the minority carrier diffusion length. Typically, the diffusion length in silicon wafers is measured at various stages of fabrication of microelectronic chips to measure the concentration of potentially harmful impurities inadvertently introduced into the wafer. Frequent monitoring of the minority carrier diffusion length helps to identify when a given process or a given tool starts to contaminate wafers above a permissible level. Preventive maintenance of processing equipment or replacement of chemicals done at this stage helps to avoid large manufacturing loses.

A general technique for measuring diffusion length includes directing a light signal onto a semiconductor to create a surface photovoltage. A surface photovoltage results when the energy of the incident photons is above the semiconductor band gap such that it produces excess carriers (holes and electrons). As a result of photogeneration, recombination, and diffusion, a concentration profile of the excess carriers is established beneath the surface of the semiconductor wafer. Larger excess carrier concentrations near the surface of the semiconductor reduce the electric field of the surface-space charge region and thereby produce larger surface photovoltage signals.

In certain diffusion length measurements, intensity modulation of the light signal produces an ac-surface photovoltage which, in turn, produces an ac-electrical signal in a capacitor formed by the semiconductor wafer and an electrode placed near the semiconductor's surface. The ac-electrical signal is subsequently measured using a lock-in amplifier tuned to the light modulation frequency to determine the surface photovoltage. Devices for determining diffusion length via surface photovoltage measurements are described in U.S. patent application Ser. Nos. 5,025,145 and 5,663,657, the contents of which are herein incorporated in their entirety.

Typically, the diffusion length measuring techniques implemented in commercial instruments use a sequence of successive illuminations of the semiconductor with monochromic beams each being intensity modulated at the same frequency but having different wavelengths. Different wavelengths of light generate minority carriers in regions extending to different depths beneath the wafer surface. The corresponding ac-surface photovoltages produced by the different wavelengths are measured sequentially, i.e., one after another, and the resulting data of the surface photovoltage, V, vs. the excitation depth, z (i.e. the light penetration depth), are then used to calculate the minority carrier diffusion length.

The American Society for Testing and Materials (ASTM) recommends two methods to determine diffusion length by employing successively measured surface photovoltage signals. See, for example, ASTM F391-96. In both of these methods, the diffusion length calculation is based on the steady-state equation for excess minority carrier concentration at the surface and is valid for low light modulation frequencies and for minority carrier diffusion lengths that are short in comparison to the semiconductor wafer thickness.

This steady-state equation is given by the expression:

$$\Delta n = \Phi \frac{1-R}{(D/L-S)} \frac{1}{(1+zL^{-1})} \quad (1)$$

where $\Delta n$ is the excess minority carrier concentration; L is the diffusion length; z is the penetration depth; $\Phi$ is the incident photon flux; R is the reflectivity of the semiconductor; D is the minority carrier diffusion constant, $D=kT/q\mu$, where k is Boltzman's constant, T is the temperature, q is the elemental charge, and $\mu$ is the minority carrier mobility; and S is the surface recombination velocity on the front surface of the semiconductor. This expression is derived in Moss, J. Electronics and Control, 1, 126, (1955).

In the constant magnitude method, one of the ASTM-recommended methods, the photon flux, $\Phi$, is measured and it is adjusted to obtain the same surface photovoltage value for each wavelength. The method assumes that the excess carrier concentration, $\Delta n$ is constant because the photovoltage is constant. The diffusion length is then obtained, using Equation (1), for $\Delta n$=const. From a plot of the photon flux, $\Phi$, as a function of the light penetration depth, z, the diffusion length is determined as the intercept value, $L=-z_{int}$ at $\Phi$=0. The constant magnitude method is further discussed, for example, in Goodman, J. Appl. Phys. Vol. 32, p. 2550, 1961, and U.S. Pat. No. 4,333,051.

The second ASTM-recommended method, the linear constant photon flux, relies on measurements of the surface photovoltage only. These measurements are performed with low light intensity so that resulting surface photovoltage is a linear function of the photon flux. Under these conditions, the surface photovoltage is directly proportional to the minority carrier concentration, or $V=\text{const}\cdot\Delta n$, where the constant depends on the semiconductor doping and the surface charge, but does not depend on the photon flux. In this method the measuring apparatus is built in such a way that the effective photon flux entering a semiconductor, $\Phi_{eff}=\Phi(1-R)$, is constant for all wavelengths and, thus, for all penetration depths, z. For short L values, the diffusion length is obtained by plotting the inverse of the photovoltage signal, $\Phi_{eff}/V$, as a function of penetration depth, z. An intercept value, at $\Phi_{eff}/V=0$ gives $L=z_{int}$. This method is further discussed in U.S. Pat. Nos. 5,025,145 and 5,177,351, and in Solid State Technol. 35, 27 (1992) and in Semicond. Sci. Technol. 7, A185 (1992). An improved version of this method suitable for long diffusion length, i.e., when the minority carrier diffusion length exceeds the wafer thickness, is also discussed in U.S. Pat. No. 5,663,657 and ASTM stock # STP1340 p. 125 (1998), by Lagowski et. al.

SUMMARY OF THE INVENTION

The present invention provides a surface photovoltage (SPV) apparatus and method for measuring the minority carrier diffusion length, L, which is faster, e.g., at least twice as fast, than existing methods. The enhancement in speed is achieved by replacing a plurality of successive surface photovoltage measurements with a single simultaneous measurement of all surface photovoltage signals (for all penetration depths) at the same moment of time.

The apparatus of the invention uses a linear constant photon flux method described in previous section to determine the minority carrier diffusion length. The apparatus illuminates simultaneously a semiconductor wafer with a beam containing an entire set of wavelengths rather than with consecutive beams of different wavelengths. Each component of the beam, i.e., each monochromatic wavelength in the set, is modulated with a different frequency, (i.e. $\lambda_1$ with the frequency $f_1$, $\lambda_2$ with the frequency $f_2$, etc), rather than with the same frequency. Amplitudes and phases of all SPV signals generated by each different wavelength are simultaneously measured using parallel lock-in amplifier inputs tuned respectively to different frequencies. For example, the photovoltage amplitude $V_{f1}$, and the phase $\phi_{f1}$ are measured at frequency $f_1$ and the photovoltage $V_{f2}$ and the phase $\phi_{f2}$ are measured at frequency $f_2$. In general, each of the monochromatic wavelengths has a different center wavelength and a linewidth, full-width at half-maximum (FWHM), such as equal to or less than about 15 nm, 10 nm, or 5 nm.

In one aspect, the invention features a method of analyzing semiconductor samples by determining minority carrier diffusion length. The method includes illuminating simultaneously a region of the semiconductor with light including a plurality of wavelengths, wherein each wavelength within the plurality is modulated at a different frequency, and a flux of the light being substantially constant for all wavelengths and at a level to generate a surface photovoltage as linear function of the flux; detecting simultaneously a surface photovoltage produced in the semiconductor for each wavelength of the plurality of wavelengths in the light; correcting the frequency dependence of the surface photovoltages to produce frequency corrected surface photovoltages; and calculating the minority carrier diffusion length with the frequency corrected surface photovoltages.

In another aspect, the invention features, a method of analyzing semiconductor samples by determining minority carrier diffusion length. The method includes illuminating simultaneously a region of the semiconductor with light including a plurality of wavelengths, wherein each wavelength within the plurality of wavelengths is modulated at a different frequency; and detecting simultaneously a surface photovoltage produced in the semiconductor by at least two of the plurality of wavelengths in the light. The method can further include adjusting a flux of each wavelength in the light until the flux is substantially constant for all wavelengths and at a level where surface photovoltage produced by illumination is a linear function of the flux. The method can also include correcting the frequency dependence of the detected surface photovoltages to produce frequency corrected surface photovoltages, and calculating the minority carrier diffusion length with the frequency corrected surface photovoltages.

Embodiments of these aspects may include one or more of the following. The surface photovoltages are simultaneously detected by an electrode placed in proximity to the illuminated site on the semiconductor. Each of the surface photovoltages monitored by in monitoring the amplitudes of surface photovoltages detected via the electrode at each of the different modulation frequencies of the light. The method further includes monitoring the phases of the surface photovoltages at each of the different modulation frequencies of the light. Correcting the frequency dependence includes using at least one monitored phase to adjust the amplitude of at least one surface photovoltage. The phase and the amplitude to be adjusted are monitored at the same modulation frequency. Calculating the minority carrier diffusion length includes analyzing the frequency corrected surface photovoltages as a function of light penetration depth. The light penetration depth is given by $$z=[84.732/\lambda+(0.110/\lambda-0.068)(T_w-293)-76.417]^{-2}$$

where $T_w$ is the wafer temperature and $\lambda$ is the wavelength of light. Determining L, the minority carrier diffusion length, further includes fitting the surface photovoltage for each light penetration depth to $V=\text{const.}\cdot\phi_{eff}\cdot f(z)$ where $$f(z) = \frac{1}{1-z^2/L^2}[1-(B/L)z],$$

$$B = \frac{(v/S_b)\sinh(T/L)+\cosh(T/L)}{\sinh(T/L)+(v/S_b)\cosh(T/L)},$$

$S_b$ is the back surface recombination velocity, and $v=D/L$ is the minority carrier diffusion velocity. The minority carrier diffusion length is determined via the expression $L=(z_1-r_{21}z_2)/(r_{21}-1)$ where $r_{21}$ is the ratio of the two surface photovoltages associated with the penetration depths $z_1$ and $z_2$. Correcting the frequency dependence of the surface photovoltages includes recalculating the surface photovoltage to a low frequency limit surface photovoltage. Correcting the frequency dependence of the surface photovoltages includes recalculating the surface photovoltages to a single modulation frequency. The single modulation frequency corresponds to one of the modulation frequencies of the light. Each of the individual wavelengths in the light penetrates into the semiconductor to different penetrating depths beneath the surface of the semiconductor.

In another aspect, the invention features an apparatus for determining the minority carrier diffusion length of a semiconductor sample. The apparatus includes a translatable mount for holding a semiconductor sample; an illuminating system for simultaneously directing a plurality of wavelengths of light each modulated at a different modulation frequency onto a semiconductor sample; and a detector system for simultaneously monitoring a plurality of surface photovoltages at the different modulation frequencies.

In another aspect, the apparatus includes an SPV probe for measuring the surface photovoltage of a semiconductor wafer as described in U.S. Pat. No. 5,663,657. The probe receives the light beam containing a plurality of wavelengths, (at least two,) and passes it to the surface of a semiconductor wafer to induce photovoltage. In a preferred embodiment the probe connects with one end of a fiber optic bundle. On the second end the bundle splits into a series of fiber cables receiving modulated light beams with different wavelengths and also constant light beam from a detrapper.

In another aspect, the apparatus includes an illumination system with multiple wavelength light sources and devices for modulating the intensity of light beams with different frequencies. Preferably the light sources are pre-adjusted such that all wavelengths have the same amplitude of effective photon flux, i.e. $\phi_{eff}^0 = \phi^0(1-R)$. In addition, the illumination system shall permit for changing, $\phi_{eff}^0$, in order to obtain the SPV linear condition in which the surface photovoltage is directly proportional to $\phi_{eff}^0$. These two aspects are important in order to use the constant photon flux linear SPV method for calculating the minority carrier diffusion length from the measured values of surface photovoltage.

Advantages of the invention include one or more of the following. The new apparatus and method of measuring SPV eliminates errors associated with previous methods caused by changes in surface condition of the wafer between successive measurements. For example, in previous methods, the time delay between successive SPV measurements for different light penetration depths, i.e., different wavelengths of light, creates an error in the minority diffusion length. Thus the method of this invention is more accurate and makes it possible to measure smaller concentrations of metal impurities in substantially shorter times.

The apparatus and method also improves the speed and accuracy of diffusion length mapping of whole semiconductor wafers by producing a distribution pattern of metallic contamination in each wafer to help identify contaminating tools and processes during manufacturing. In previous whole semiconductor wafer mappings, measurements were performed along certain scanning lines (e.g. a ring in case of rotating wafer) first for one wavelength followed by measurements with a second wavelength. The delay, typically 6 seconds, between sequentially measuring the first and second SPV results in changes in the surface condition of the wafer, e.g., static charge created by wafer motion, surface relaxation after previous chemical treatments, and adsorption or desorption caused by ambient changes. These changes alter the SPV signal value and thereby create errors in diffusion length measurement. Errors and corresponding artifact patterns in full wafer mapping produced from previous methods are eliminated in the present invention by performing measurements of surface photovoltage for all wavelengths at exactly the same time.

As used herein, the term surface photovoltage corresponds to a reduction of the surface space charge width during illumination and to its recovery in the dark. The SPV signal amplitude decreases with increasing the light modulation frequency due to a long surface space charge recovery time, $\tau_R$. This time can be orders of magnitude larger than the effective minority carrier lifetime and then the time required to establish steady-state concentration profile, $\Delta n$, in the wafer beneath the surface space charge region. As discussed U.S. Pat. No. 5,977,788, the surface photovoltage can be expressed as $$V(\omega) = V^0(1+\omega^2\tau_R^2)^{-2} \tag{2}$$

where $\omega$ is the angular frequency, $\omega = 2\pi f$ and $V^0$ is the surface photovoltage amplitude for $f \to 0$. The recovery time $\tau_R$ is related to the SPV signal phase shift by a well known relationship expression derived by NAKHMANSON, in Solid State Electronics, Vol. 18 p. 617(1975):

$$\omega\tau_R = \tan^{-1}(\Delta\phi) \tag{3}$$

where $\Delta\phi$ is the phase shift between the light modulated with an angular frequency $\omega$ and the SPV signal. The method uses the SPV signal phase shifts, $\Delta\phi_{f1}, \Delta\phi_{f2}, \ldots \Delta\phi_{fk}$ that are measured by the lock-in amplifier simultaneously with the amplitude of SPV signal.

The corrected set of SPV signal amplitudes, i.e., $V_1, V_2, \ldots, V_k$, recalculated to the same frequency (preferably to the lowest light modulation frequency, $f_1$) each corresponding to light penetration depths, i.e., $z_1, z_2, \ldots Z_k$, are used to calculate the minority carrier diffusion length from well-known steady-state SPV equations discussed in U.S. Pat. No. 5,663,657.

DESCRIPTION OF THE METHOD

Figure 1:
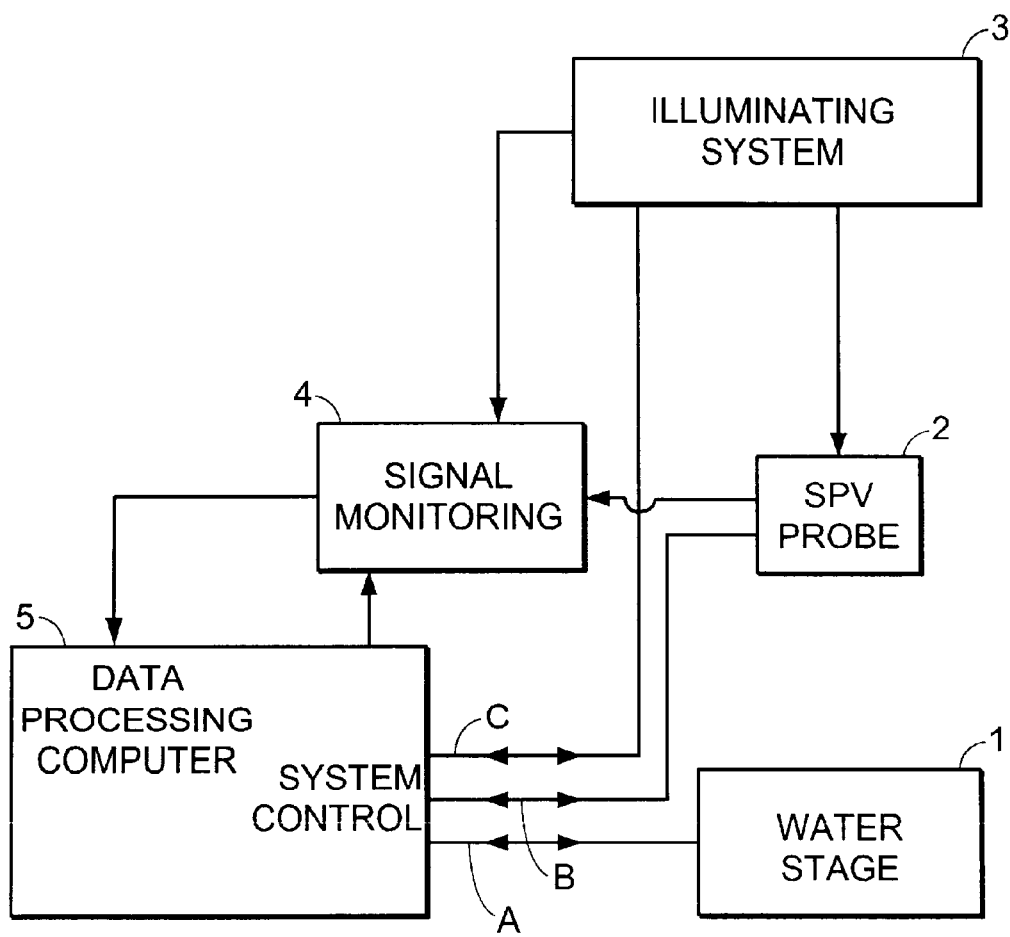
FIG. 1 is a block diagram of apparatus for measuring minority carrier diffusion length.

Referring to FIG. 1, a block diagram of an automated apparatus 100 for measuring the minority carrier diffusion length in a semiconductor wafer is shown. Apparatus 100 includes a motorized wafer stage 1 for holding a semiconductor wafer (not shown) during minority carrier diffusion length measurements. An illuminating system 3 illuminates the semiconductor wafer to generate a surface photovoltage. A SPV probe 2 detects and sends an electronic signal, i.e., SPV, to a signal monitor 4. Signal monitor 4, in turn, sends an electronic signal to a central processing unit (CPU) 5 which based on the value of the electronic signals received from signal monitor 4 calculates the minority diffusion length.

Figure 2:
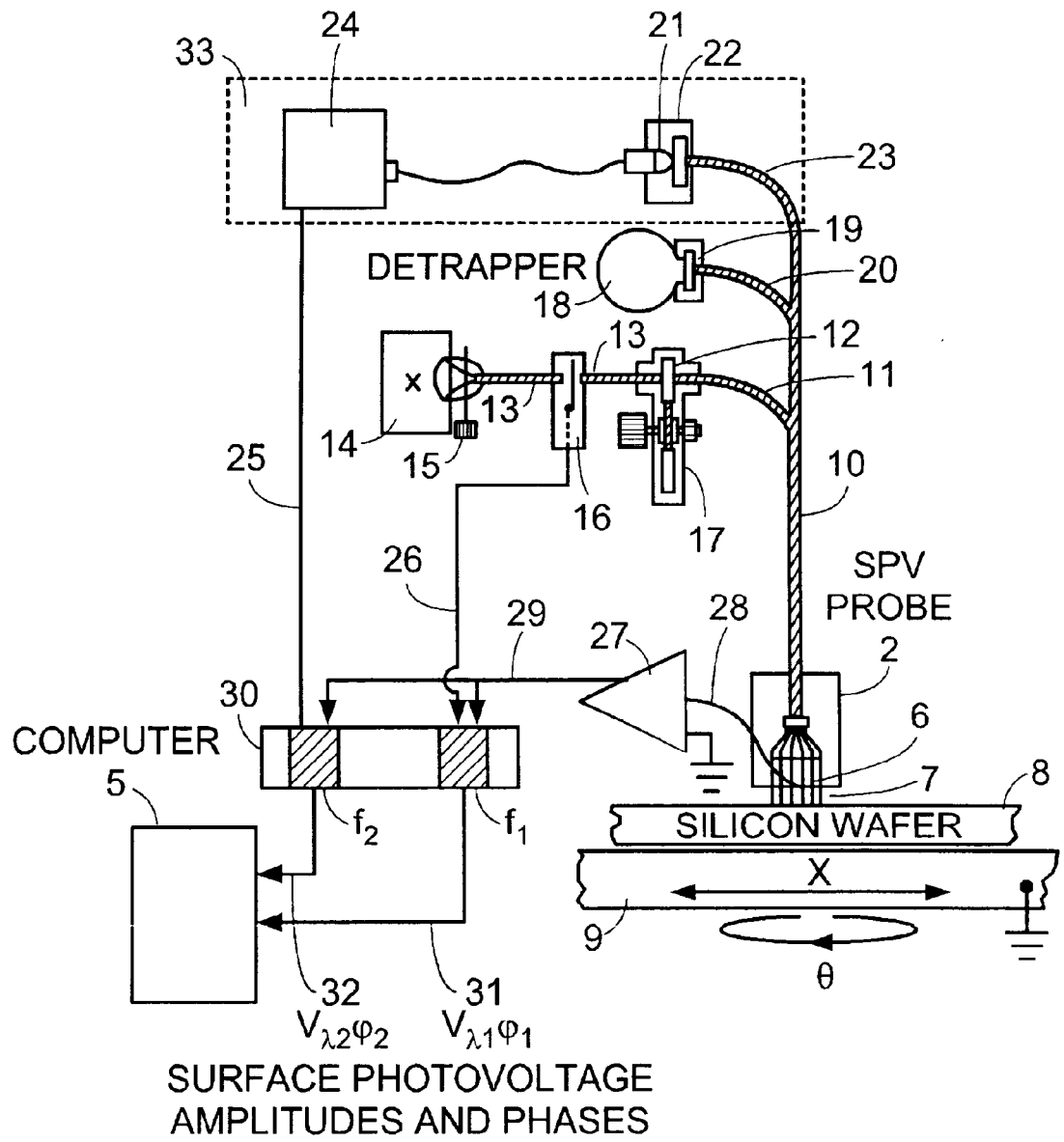
FIG. 2 is a schematic diagram of the apparatus of FIG. 1.

Referring to FIGS. 1 and 2, motorized wafer stage 1 holds a semiconductor wafer 8 by means of vacuum suction on a wafer chuck 9. Wafer stage 1 positions semiconductor wafer 8 under SPV probe 2 and CPU 5 controls the motion of wafer stage 1 via a two-way communication line A. Wafer chuck 9 contains a temperature sensor (not shown) to measure the temperature, $T_w$, of semiconductor wafer 8 during the minority carrier diffusion length measurements. The temperature sensor sends an electronic signal proportion to the value of $T_w$ to the CPU 5. CPU 5 uses this value to calculate correct values of the light penetration depth, z, for each wavelength used in the measurement. This calculation is done using the empirical formula:

$$z=[84.732/\lambda+(0.110/\lambda-0.068)(T_w-293)-76.417]^{-2} \tag{4}$$

where z and X are expressed in units of micrometers and $T_w$ is expressed in units of Kelvin degrees.

During operation, CPU 5 sends an electronic signal via communication line B to SPV probe 2 causing the probe to lower until a transparent SPV pick-up electrode 6 reaches a working distance from the top surface of the wafer 8. Typically, the working distance is about 250 μm above the wafer surface. In general, the working distance is adjusted so that apparatus 100 can measure long diffusion lengths or very low levels of contamination. For instance, the working distance is adjusted such that the capacitance of the electrode-wafer is large enough for a SPV electrode of about 6 mm in diameter to pick up signals in the milivolt range with a precision of about 1 micro-volt. In order to create an SPV signal, illuminating system 3 sends a modulated light beam 7 by a fiber optic bundle 10 to SPV probe 2. Modulated light beam 7 passes through transparent SPV pick-up electrode 6 mounted in the SPV probe 2 and illuminates semiconductor wafer 8. Illuminating system 3 supplies light to fiber optic bundle 10 via fiber optic cables 11, 20, and 23 which split from the bundle at the end opposite to the SPV probe 2.

Light in fiber optic cable 11 originates from a halogen light source 14 which passes through an iris 15 (controlled by CPU 5 to adjust beam intensity). The light signal exits iris and propagates through an optical cable 13 and a light chopper 16 which modulates the light amplitude with a frequency $f_1$ (for example, 512 Hz). The modulated light then propagates through a narrow band pass filter 12 in an optical wheel 17 to produce a first modulated monochromatic light beam having a wavelength $\lambda_1$ (for example 1.004±0.005 μm) and modulated frequency, $f_1$, which passes though fiber cable 11 and into fiber bundle 10. In general, the linewidth of the light signal should be about 5nm at the full-width half-maximum (FWHM). A second modulated monochromatic beam having a wavelength $\lambda_2$ and modulated frequency, $f_2$, is supplied to fiber bundle 10 via fiber optic cable 23. The second light beam originates from the light emitting diode (LED) 21 which emits light at the wavelength, $k_2$, (for example, GaAlAs diode emitting at 0.78 μm). Typically, the wavelengths of the light signal are selected so that they do not overlap one another and thereby penetrate into different depths of semiconductor wafer 8. Light from LED 21 passes through a narrow band pass filter 22 with a transmission centered at $\lambda_2$ before it enters a cable 23. The second beam is modulated at frequency $f_2$, e.g., 572 Hz, by modulating the power sent from LED power supply 24 to LED 21. The modulating frequency is controlled by CPU 5.

In addition to the first and second modulated beams, light beam 7 may also contain an unmodulated light beam from a detrapper 18. The unmodulated light beam from detrapper 18 passes through a thick silicon filter 19, e.g., about 1 mm in thickness, to produce an unmodulated light beam which can be used to produce uniform generation of excess carriers of typical thickness lower than 1 mm in semiconductor wafers, such as silicon. The unmodulated light beam from detrapper 18 propagates through fiber optic cable 20 and into fiber optic bundle 10. The unmodulated light component does not generate any ac-SPV signal, instead it is used to saturate minority carrier traps uniformly across the thickness wafer. Often minority carrier traps are present in p-type silicon wafer from ingots grown by the Czochralski method. As a result, the minority carrier traps, if not saturated, can lower significantly the minority carrier diffusion length, and thereby interfere with a reliable determination of the metal contaminants.

The effective photon flux of light 7 impinging on semiconductor wafer 8 has a form:

$$\Phi_{\textit{eff}}=\Phi_{\lambda 1}\cos(\omega_1 t+\phi_{10})+\Phi_{\lambda 2}\cos(\omega_2 t+\phi_{20})+\Phi_{Det} \quad (5)$$

where $\omega$ is the angular frequency of light modulation, $\omega_1=2\pi f_1$ and $\omega_2=2\pi f_2$, $\phi_0$ is the phase of modulated light, $\Phi_{\lambda k}$ (k=1,2) is the photon flux amplitude in which the subscript 1 and 2 refer to a light beam having a wavelength of $\lambda_1$ and $\lambda_2$, and $\Phi_{Det}$ is the photon flux of the unmodulated light beam from the detrapper. Typically, the fluxes are preset to have a constant effective value for bare silicon when using the linear constant photon flux method for determining the minority carrier diffusion length.

The surface photovoltage generated between the wafer 8 and the electrode 6 by the flux, $V_{101\ \textit{eff}}$, using Eqn. 5 is:

$$V(t)=V_{\lambda 1}\cos(\omega_1 t+\phi_1)+V_{\lambda 2}\cos(\omega_2 t+\phi_2) \quad (6)$$

where $V_{\lambda 1}$ and $V_{\lambda 1}\square$ are amplitudes of signal components and $\phi_1$ and $\phi_2$ are signal phases. Electrode 6 sends an electronic signal proportional to the SPV signal via electronic cable 28 to a high input resistance preamplifier 27 which, in turn, sends an amplified electronic signal to two inputs in a lock-in amplifier 30 in signal monitor 4 (FIG. 1) via electronic cable 29. Lock-in amplifiers are well known and are used very frequently for precise measurement of ac-electrical signals. An example a two input lock-in amplifier is the model 7265 DSP LOCK-IN AMPLIFIER manufactured by EG&G Instruments, located in Princeton, N.J. Lock-in amplifier 30 receives a reference signal 26 proportional to the modulating frequency, $f_1$, of chopper 16 and a reference signal 25 proportional to the modulating frequency, $f_2$, at which LED power supply 24 modulates LED 21. Using the modulating frequencies $f_1$ and $f_2$, lock-in amplifier measures two SPV signal amplitudes and phases described above in Eqn. 6, e.g., one produced from the portion of light 7 having a wavelength $\lambda_1$ modulated at $f_1$ and another produced from the portion of light 7 having a wavelength $\lambda_2$ modulated at $f_2$. Lock-in amplifier 30 sends electronic signals proportional to the amplitudes and the phases of both SPV signal components to CPU 5 via electronic lines 31 and 32.

An initial step in diffusion length measurements involves verifying and adjusting the linearity of surface photovoltage by measuring the amplitude corresponding to the shorter wavelength SPV signal, $V_{\lambda 2}$ in the case described above, for two values of the photon flux, $\phi_{\lambda 2}$, with a preset ratio, e.g., a ratio of about 2.00. In the linear regime, the ratio of the measured SPV will be approximately equal to the photon flux ratio. In practice, acceptable linearity occurs when the SPV signal ratio is within a prescribed range from the ideal ratio. For example, a typical linearity criterion would require that the SPV signal ratio be equal or larger than about 1.975 when the photon flux ratio is set at about 2.00. Typically, when the observed ratio is lower than the ideal ratio, the photon fluxes are too high. As a result, the higher photon fluxes cause disproportionally higher SPV signals. In this instance, a linearity adjustment step is required. The linearity adjustment step involves adjusting the photon flux to obtain a linear SPV. In general, the shortest wavelength light produces the largest SPV signal and the largest non-linearity. As a result, the photon flux of the shortest wavelength signal $V_{\lambda 2}$ is adjusted to obtain a linear SPV range. When the linearity SPV criterion is satisfied for the shortest wavelength it, typically, is also satisfied for longer wavelengths of the light beam having the same effective photon flux. As a result, linearity adjustments for longer wavelengths are not necessary.

For the apparatus described above, the linearity adjustment step includes adjusting the intensity of the shorter wavelength light, i.e., the LED emission or the photon flux, $\phi_{\lambda 2}$, until the linearity criterion is satisfied. CPU 5 controls the LED photon flux by adjusting LED power supply 24 such that it alters the magnitude of voltage supplied to LED 21. CPU 5 determines how to adjust the voltage by using a LED output intensity vs. supply voltage look-up table stored in its memory. CPU 5 can also control the photon flux, $\phi_{\lambda 1}$, of light having a wavelength $\lambda_1$ by adjusting iris 15.

Figure 3:
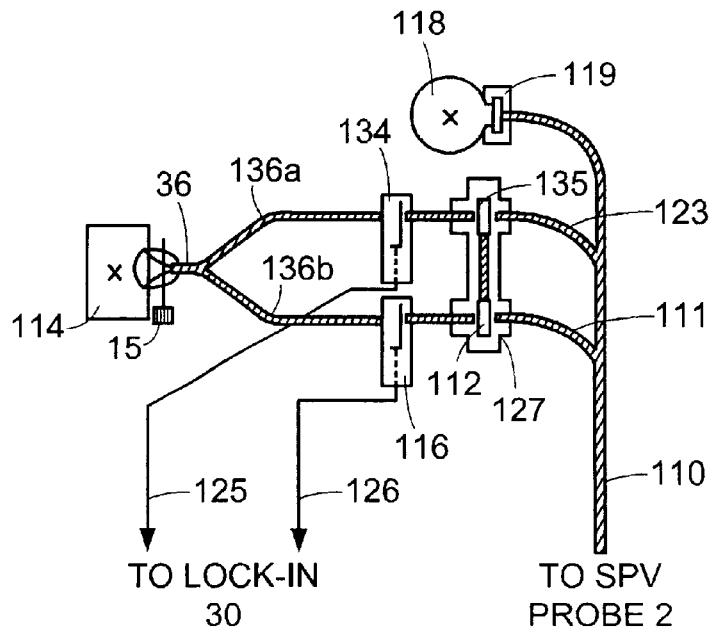
FIG. 3 is a schematic diagram of an alternative illuminating system used in the apparatus of FIG. 2.
Figure 4:
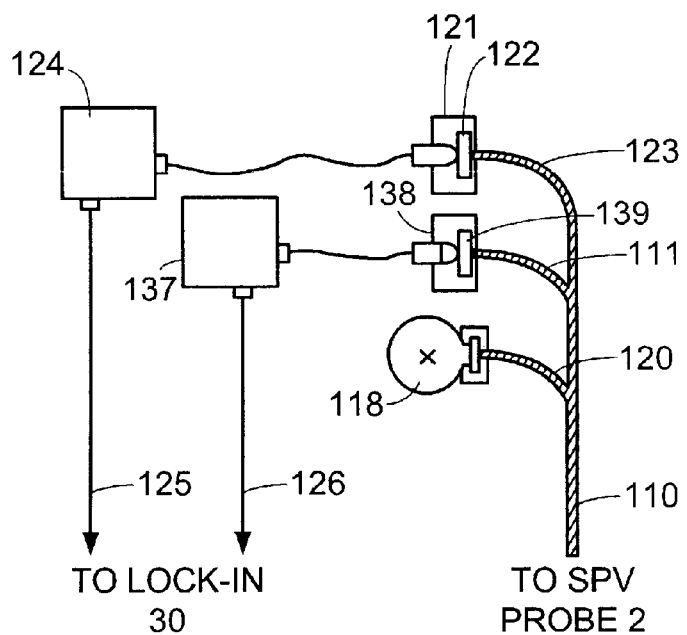
FIG. 4 is a schematic diagram of an alternative illuminating system used in the apparatus of FIG. 2.

Referring to FIGS. 3 and 4, other suitable automated apparatuses for measuring minority carrier diffusion length are shown. For simplicity, FIGS. 3 and 4 only show the illuminating system for each apparatus. In FIG. 3, light from a halogen light source 114 propagates through two fiber optic cables 136a and 136b into two light choppers 116 and 134 which modulate the two light signals at different frequencies, $f_1$ and $f_2$, respectively. The modulated light signals from choppers 116 and 134 pass through separate narrow band pass filters 135 and 112 centered at $\lambda_1$ and $\lambda_2$, through optic cables 123 and 111, and into fiber optic bundle 110. In FIG. 4, light emitting diode 138 emits light at wavelength $\lambda_1$ having a modulating at frequency $f_1$ and light emitting diode 121 emits light at wavelength $\lambda_2$ having a modulating at frequency $f_2$. Each light signal is filtered by narrow band pass filters 139 and 122, respectively, before joining fiber optic bundle 110 via fiber optic cables 111 and 123. Power supplies 124 and 137 for light emitting diodes 138 and 121 are calibrated and controlled by the CPU (not shown) for precise adjustments of the photon fluxes.

Correction for Frequency Differences

Figure 5:
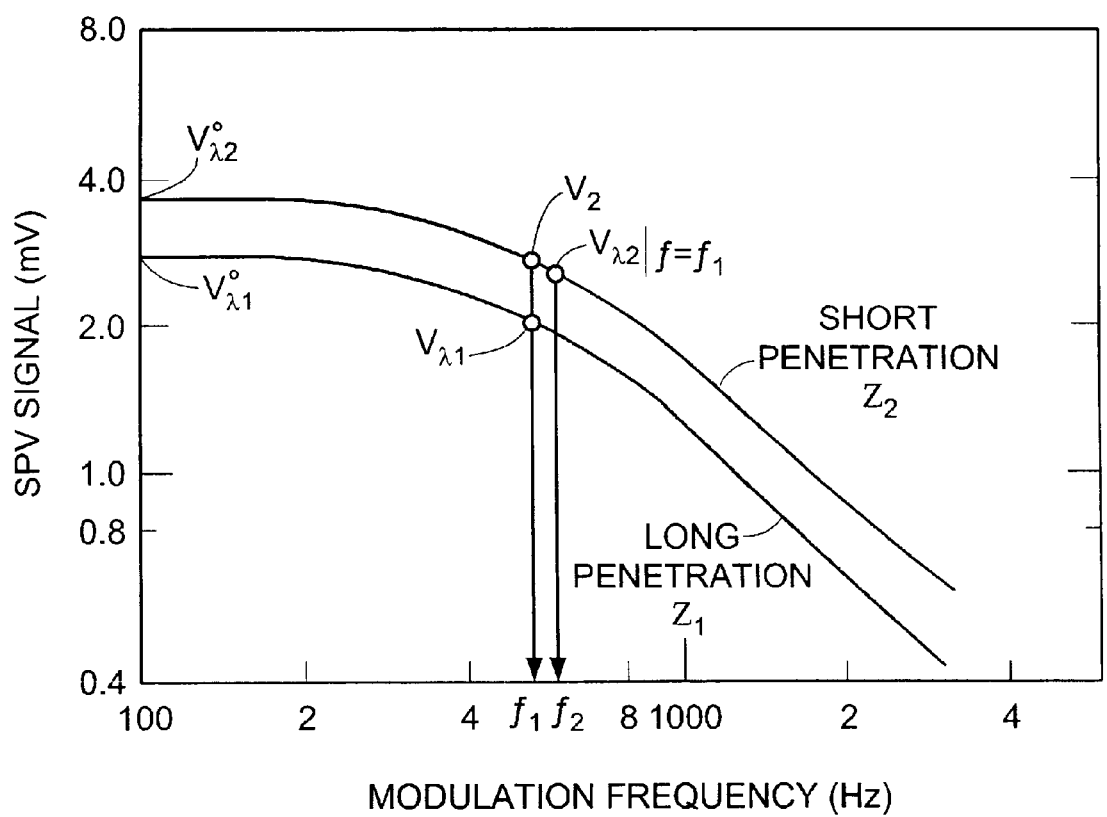
FIG. 5 is a graph plotting the surface photovoltage signal as a function of light modulation.

The minority carrier diffusion length is calculated from a dependence of the amplitude of ac-surface photovoltage on the light penetration depth. As shown in FIG. 5, SPV signal amplitudes tend to decrease with increasing light modulation frequency. For example, $V_{\lambda 2}|f=f_2$ measured at modulation frequency $f_2$ has a value lower than $V_2=V_{\lambda 2}|f=f_1$, (i.e. a value $V_{\lambda 2}$ would have if it was measured at a frequency $f_1$). As a result, the measured SPV amplitudes need to be recalculated to obtain corrected amplitudes each corresponding to a SPV amplitude recorded at the same modulation frequency. Preferably, the amplitudes are recalibrated to new amplitudes which would have occurred at a preselected modulation frequency low enough to satisfy the steady-state condition. Typically, the amplitudes are recalibrated to those values which would have occurred at the smallest modulation frequency being used. The SPV amplitudes are recalculated by using the phases of the SPV signal which are measured simultaneously with SPV amplitudes. There are two methods of recalibrating the SPV signal amplitudes.

The first frequency correction is designed to calculate the value of $V_2$ from the measured value of $V_{\lambda 2}|f=f_2$ (i.e. a value $V_{\lambda 2}$ would have if it was measured at a frequency $f_1$). Then the values of $V_2$ and $V_{\lambda 1}$, both corresponding to the same frequency $f_1$ are used for calculation of the diffusion length. The second frequency correction calculates the SPV values at low modulating frequency for all SPV signals having different wavelengths, i.e., $V_{\lambda 1}^0$, $V_{\lambda 2}^0$, ... $V_\lambda^0$. The low frequency limits can also be used for calculating the diffusion length.

The First Frequency Correction:

Typically, the first frequency correction is performed on the SPV value corresponding to the shortest wavelength (short penetration depth) because for long wavelength (long penetrations depth) the SPV dependence on frequency may be more complex than that described by equation 2 and 3. For example, as shown in FIG. 5, for higher frequencies, the SPV induced by a beam having longer penetration depth SPV may decrease at a rate larger than the $V\sim 1/f$ decrease characteristic for a beam having a shorter penetration depth SPV. The procedure for calculating $V_2$ from the observed $V_{\lambda 2}$ value uses a relation obtained from Eqn. 2 and a $\tau_R$ value calculated from Eqn. 3. The phase shift value, $\Delta\phi_2 = \phi_{20}-\phi_2$, in Eqn. 3 needed to calculate $\tau_R$ is measured by the lock-in amplifier for a modulation frequency $f_2$. The frequency correction formula for correcting $V_{\lambda 2}$ from $f_2$ to $V_2$ at $f_1$ is:

$$V_2 = C_{21} \cdot V_{80\ 2} \qquad (7a)$$

where the correction coefficient $C_{21}$ is given by the expression:

$$C_{21} = [1+\tan^{-2}\Delta\phi_2]^{1/2}/[1+(f_1/f_2)^2\tan^{-2}\Delta\phi_2]^{1/2} \qquad (7b)$$

For example, the frequency correction for SPV measurement with two beams having wavelengths $\lambda_1=1.004\ \mu m$ and $\lambda_2=0.780\ \mu m$ and corresponding light modulation frequencies $f_1=512$ Hz and $f_2=572$ Hz, respectively, resulted in SPV values of $V_{\lambda 1}=2.063$ mV and $V_{\lambda 2}=2.741$ mV. The phase shift value for the shorter wavelength was $\Delta\phi_2=-59.5°$. Only one phase shift value is needed for calculating the frequency correction. This is true even when more than two monochromatic light beams are used. Using Eqn. 7b, $C_{21}$ is calculated to be about 1.0246. Plugging this value of $C_{21}$ into Eqn. 7a, $V_2$ is calculated to be about 2.808 mV. The values of $V_{\lambda 1}=2.063$ mV and $V_2=2.808$ mV are then used to calculate the diffusion length as described below.

The Second Frequency Correction:

The SPV signals can also be recalculated to obtain the low frequency limiting values, for example, the values $V_{\lambda 1}^0$ and $V_{\lambda 2}^0$ for the data given in FIG. 5 which, in turn, can be used to calculate the minority carrier diffusion length. The correction formulas for obtaining the low frequency limiting values derived from Eqns. 2 and 3 are:

$$V_{\lambda 1}^0 = V_{\lambda 1}[1+(f_1/f_2)^2\tan^{-2}\Delta\phi_2]^{1/2} \qquad (8a)$$

$$V_{\lambda 2}^0 = V_{\lambda 2}[1+\tan^{-2}\Delta\phi_2]^{1/2} \qquad (9b)$$

Using the same exemplary data provided above, $V_{\lambda 1}^0 = 2.063 \times 1.131 = 2.333$ mV (Eqn. 8a), and $V_{\lambda 2}^0 = 2.741 \times 1.161 = 3.182$ mV (Eqn. 8b).

The first and the second frequency corrections produce similar ratios of SPV signals, i.e., $V_2/V_{\lambda 1}=1.361$ and $V_{\lambda 2}^0/V_{\lambda 1}^0=1.364$. Since the minority carrier diffusion length is determined by a value of the SPV signal ratios, both frequency corrections would give practically the same L value. In general, such a good agreement between the two frequency corrections indicates that the frequency, $f_1$, is sufficiently low such that the SPV values resulting from longer penetration depth are not affected by a stronger than 1/f decrease in SPV value. If the two ratios of frequency corrected SPV signal are not similar, the modulating frequencies can be adjusted so that the light beam having longer penetration depth produces a SPV signal having an approximately 1/f dependence on modulating frequency.

Calculation of the Minority Carrier Diffusion Length (L)

Approximate Procedure

An approximate minority carrier diffusion length value can be calculated using approximate relationship for L, when L is smaller than about 60% of the thickness, T, of the measured semiconductor wafer. The approximation is:

$$L = (z_1 - rz_2)/(r-1) \qquad (9)$$

where r is the SPV signal ratio, and $Z_k$ are the light penetration depths calculated at measurement temperature, $T_w$, using Eqn. 4. For $T_w=28.4°$ C., $\lambda_1=1.004\ \mu m$, and $\lambda_2=0.780\ \mu m$, $z_1$ is equal to 144.9 $\mu m$ and $z_2$ is equal to 9.3

μm. Using the SPV ratio from the exemplary first frequency correction, $V_2/V_{\lambda 1}=1.361$, L is approximately 366 μm, which corresponds to about 50% of the wafer thickness. Using the exemplary second frequency correction, $V_{\lambda 2}^0/V_{\lambda 1}^0=1.364$, L is approximately 363 μm. The two-frequency correction procedures give L values differing by less than 1%.

Accurate Procedure

A more accurate procedure relative to the approximate procedure described above takes into account the wafer thickness and involves solving the equations discussed in U.S. Pat. No. 5,663,657 and in an article by Lagowski et al. entitled "Present Status of the Surface Photovoltage Method (SPV) for Measuring Minority Carrier Diffusion Length and Related Parameters." In this approach the surface photovoltage signals measured under constant photon flux for different light penetration depth, z, are fitted to expressions:

$$V = \text{const.} \cdot \phi_{\textit{eff}} f(z) \quad (10)$$

where $$f(z) = \frac{1}{1-z^2/L^2}[1-(B/L)z] \quad (11)$$

$$B = \frac{(v/S_b)\sinh(T/L) + \cosh(T/L)}{\sinh(T/L) + (v/S_b)\cosh(T/L)} \quad (12)$$

$S_b$ is the back surface recombination velocity and v=D/L is the minority carrier diffusion velocity. In high purity silicon, D is 33 cm²/s for electrons and 13 cm²/s for holes. The fitting, i.e., the calculation of L from Eqns. 10–12, is done using an iterative procedure with L treated as the best fit parameter. Since the value of L is sensitive to the $S_b$ value, the operator can use a default value of $S_b=10^4$ cm/s appropriate for bare silicon wafers or a low value $S_b=10$ cm/s appropriate for silicon wafers with an oxidized back surface. For constant photon flux measurement with only two beams, Eqns. 10 and 11 result in $$r = f(z_2)/f(z_1) = \frac{1-z_1^2/L^2}{1-z_2^2/L^2} \cdot \frac{1-(B/L)z_2}{1-(B/L)z_1} \quad (13)$$

Using the measured r-value, the diffusion length, L, is determined by solving the equation 13. The solution can be conveniently obtained using an iterative procedure. The minority carrier diffusion length L determined via this procedure is 404 μm and 401 μm using the values provided above for the exemplary first and second frequency correction procedures. The back surface recombination value $S_b=10000$ cm/s was used, which is a typical value for unoxidized bare silicon wafer used in this measurement.

Measurement of oxidized wafers

Presence of oxide film on a top surface of the wafer changes the effective photon fluxes entering semiconductor. If the oxide thickness is known, corresponding corrections can be calculated using a standard thin film reflectivity formula. The procedure is discussed. U.S. Pat. No. 5,663,657. The diffusion length for oxidized silicon is calculated by replacing r by $r^*=r(\phi_{\textit{eff}1}^1/\phi_{\textit{eff}2}^1)$; where $\phi_{\textit{eff}1}^1$ and $\phi_{\textit{eff}2}^1$ are effective photon fluxes for wavelength $\lambda_1$ and $\lambda_2$ taking into account an effect of thin film reflectivity. Using r* instead of r, L can then be calculated via the approximate method, i.e., with Eqn. 9, or from the accurate method, i.e., with Eqn. 13.

SEQUENCE OF MEASUREMENT

Figure 6:
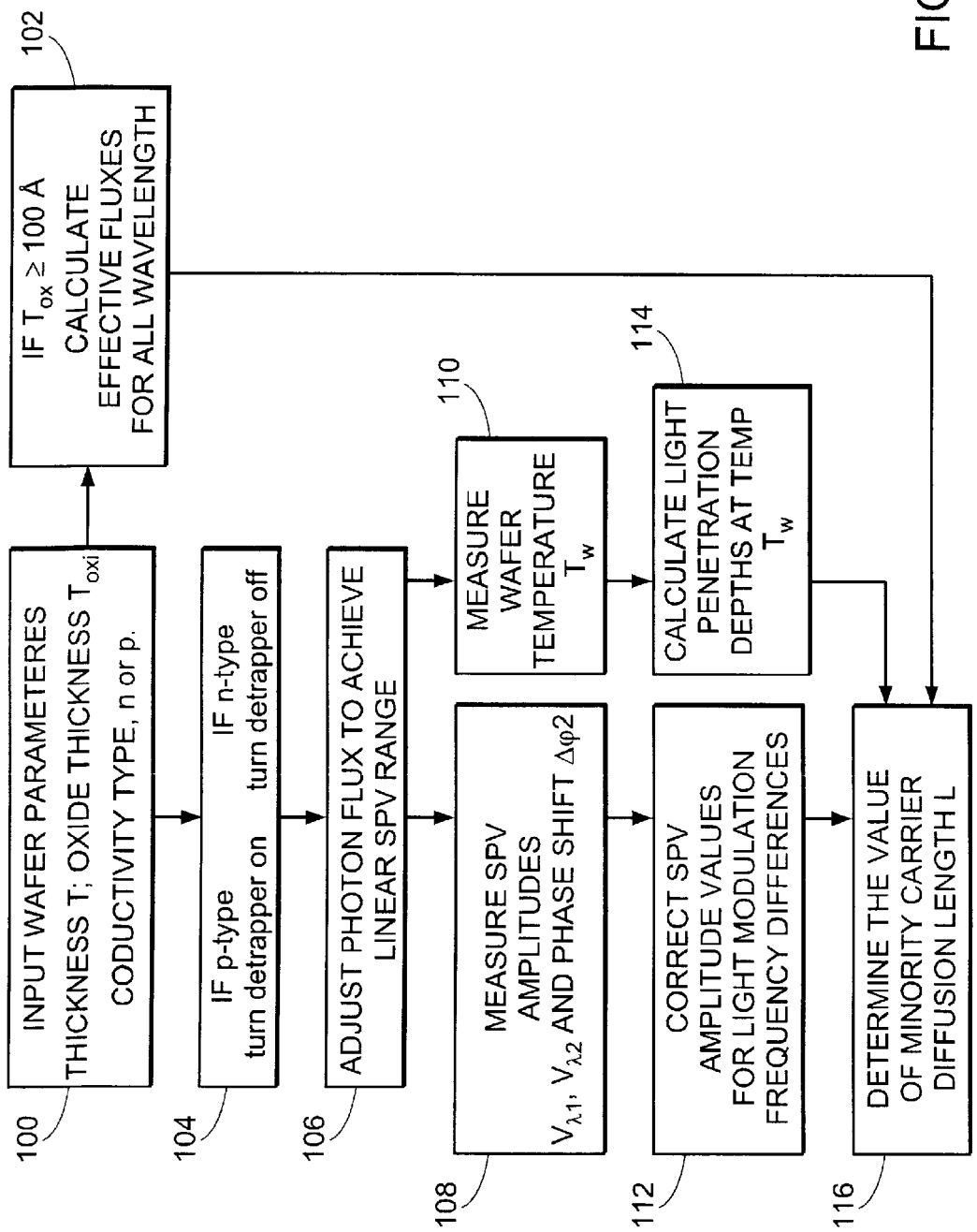
FIG. 6 is a flow diagram representing a sequence of step for measuring minority carrier diffusion length.

Referring to FIG. 6, a schematic representation of the measurement sequence is shown. Step 100 requires that the user input certain parameters characterizing the wafer, e.g., wafer thickness, T, oxide thickness, Tox, and conductivity type. The wafer thickness, T, is required in step 116 to calculate L when L exceeds T/2. The oxide thickness is required in step 102 for oxide films thicker than 100 Å and is used to calculate effective photon fluxes for all wavelengths. The electrical conductivity, p-type or n-type, is required in step 104 to decide whether or not to turn on the detrapper. The electrical conductivity is also used to select a D value when calculating L from Eqn. 13. After entering the wafer parameter, the measurement sequence starts and the apparatus adjusts the photon flux to achieve a linear SPV range (Step 106). Step 106 is, typically, performed only on one wafer site (for example in the center). In Step 110, temperature sensor in the wafer chuck measures the temperature of the wafer. The wafer temperature, $T_w$ is used in step 114 to calculate the light penetration depth for each wavelength $\lambda_k$ used in the determining the minority carrier diffusion length. In step 108, the apparatus simultaneously measures the SPV signal amplitudes for all wavelengths. At the same time the phase shifts $\Delta\phi_k$ are measured for SPV signal generated by the shorter wavelengths. Only one phase shift, $\Delta\phi_2$, is measured when only two wavelengths are used. In wafer mapping, SPV amplitudes and $\Delta\phi_k$ are measured "in flight" i.e. while the wafer is moving under the SPV probe, and stored in the CPU. The values of SPV amplitude corresponding to each of the measured sites on the wafer are corrected for differences in light modulation frequencies (step 112) using the $\Delta\phi_k$ values. Finally, using the corrected SPV signal amplitude ratios and the light penetration depths calculated in step 114, the diffusion length values are calculated in step 116 for all measured sites on the wafer.

The simultaneous measurement method can produce a full wafer diffusion length map of data gathered "in flight" for 6000 sites on a 200 mm diameter wafer in 2 minutes and 30 seconds. A map of this density produced according to previous SPV methods would take at least about 6 minutes due to doubling the measurement time to accommodate two successive measurements at $\lambda_1$ and $\lambda_2$, and adding an equilibration time associated with changing between the two wavelengths.

Although the above apparatus and method were described for use with only two wavelengths and a silicon wafer, the apparatus and method can be extended to utilize more wavelengths or to measure the minority carrier diffusion length of other semiconductors.

Other embodiments are within the claims.

What is claimed is:

1. An apparatus for determining the minority carrier diffusion length of a semiconductor sample, comprising:

a translatable mount for holding a semiconductor sample;

an illuminating system for simultaneously directing a plurality of wavelengths of light each modulated at a different modulation frequency onto a semiconductor sample; and a detector system for simultaneously monitoring a plurality of surface photovoltages at the different modulation frequencies.

2. A method of analyzing semiconductor samples by determining minority carrier diffusion length, comprising:

illuminating simultaneously a region of the semiconductor with light including a plurality of wavelengths, wherein each wavelength within the plurality is modulated at a different frequency, and a flux of the light being substantially constant for all wavelengths and at a level to generate a surface photovoltage as linear function of the flux;

detecting simultaneously a surface photovoltage produced in the semiconductor for each wavelength of the plurality of wavelengths in the light;

correcting the frequency dependence of the surface photovoltages to produce frequency corrected surface photovoltages; and calculating the minority carrier diffusion length with the frequency corrected surface photovoltages.

3. The method of claim 2, wherein the surface photovoltages are simultaneously detected by an electrode placed in proximity to the illuminated site on the semiconductor.

4. The method of claim 3, wherein each of the surface photovoltages monitored by monitoring the amplitudes of surface photovoltages detected via the electrode at each of the different modulation frequencies of the light.

5. The method of claim 4 further including monitoring the phases of the surface photovoltages at each of the different modulation frequencies of the light.

6. The method of claim 5, wherein correcting the frequency dependence includes using at least one monitored phase to adjust the amplitude of at least one surface photovoltage.

7. The method of claim 6, wherein the phase and the amplitude to be adjusted are monitored at the same modulation frequency.

8. The method of claim 1, wherein calculating the minority carrier diffusion length includes analyzing the frequency corrected surface photovoltages as a function of light penetration depth.

9. The method of claim 8, wherein the light penetration depth is given by $$z=[84.732/\lambda+(0.110/\lambda-0.068)(T_w-293)-76.417]^{-2}$$

where $T_w$ is the wafer temperature and $\lambda$ is the wavelength of light.

10. The method of claim 9, wherein determining L, the minority carrier diffusion length, further includes fitting the surface photovoltage for each light penetration depth to $V=\text{const.}\cdot\phi_{eff}\cdot f(z)$ where $$f(z) = \frac{1}{1-z^2/L^2}[1-(B/L)z], \quad B = \frac{(v/S_b)\sinh(T/L+\cosh(T/L)}{\sinh(T/L)+(v/S_b)\cosh(T/L)},$$

$S_b$ is the back surface recombination velocity, and $v=D/L$ is the minority carrier diffusion velocity.

11. The method of claim 9, wherein the minority carrier diffusion length is determined via the expression $L=(z_1-r_{21}z_2)/(r_{21}-1)$ where $r_{21}$ is the ratio of the two surface photovoltages associated with the penetration depths $z_1$ and $z_2$.

12. The method of claim 2, wherein correcting the frequency dependence of the surface photovoltages includes recalculating the surface photovoltage to a low frequency limit surface photovoltage.

13. The method of claim 2, wherein correcting the frequency dependence of the surface photovoltages includes recalculating the surface photovoltages to a single modulation frequency.

14. The method of claim 13, wherein the single modulation frequency corresponds to one of the modulation frequencies of the light.

15. The method of claim 2, wherein each of the individual wavelengths in the light penetrates into the semiconductor to different penetrating depths beneath the surface of the semiconductor.

16. A method of analyzing semiconductor samples by determining minority carrier diffusion length, comprising:

illuminating simultaneously a region of the semiconductor with light including a plurality of wavelengths, wherein each wavelength within the plurality of wavelengths is modulated at a different frequency; and detecting simultaneously a surface photovoltage produced in the semiconductor by at least two of the plurality of wavelengths in the light.

17. The method of claim 16 further including adjusting a flux of each wavelength in the light until the flux is substantially constant for all wavelengths and at a level where surface photovoltage produced by illumination is a linear function of the flux.

18. The method of claim 16 further including correcting the frequency dependence of the detected surface photovoltages to produce frequency corrected surface photovoltages.

19. The method of claim 18 further including calculating the minority carrier diffusion length with the frequency corrected surface photovoltages.

20. The method of claim 19, wherein calculating the minority carrier diffusion length includes analyzing at least two of the detected surface photovoltages as a function of light penetration depth.

21. The method of claim 20, wherein the light penetration depth is given by $$z=[84.732/\lambda+(0.110/\lambda-0.068)(T_w-293)-76.417]^{-2}$$

where $T_w$ is the wafer temperature and $\lambda$ is the wavelength of light.

22. The method of claim 21, wherein determining L, the minority carrier diffusion length, further includes fitting the detected surface photovoltage for each light penetration depth to $V=\text{const.}\cdot\phi_{eff}\cdot f(z)$, where f(z)

$$f(z) = \frac{1}{1-z^2/L^2}[1-(B/L)z],$$

$[1-(B/L)z]$, $$B = \frac{(v/S_b)\sinh(T/L+\cosh(T/L)}{\sinh(T/L)+(v/S_b)\cosh(T/L)},$$

$S_b$ is the back surface recombination velocity, and $v=D/L$ is the minority carrier diffusion velocity.

23. The method of claim 21, wherein the minority carrier diffusion length is determined via the expression $L=(z_1-r_{21}z_2)/(r_{21}-1)$ where $r_{21}$ is the ratio of two surface photovoltages associated with the penetration depths $z_1$ and $z_2$.

24. The method of claim 18, wherein correcting the frequency dependence includes using a monitored phase of at least one of the detected surface photovoltages to adjust an amplitude of at least one of the detected surface photovoltages.

25. The method of claim 24, wherein the phase and the amplitude are monitored at the same modulation frequency.

26. The method of claim 18, wherein correcting the frequency dependence of the surface photovoltages includes recalculating the surface photovoltage to a low frequency limit surface photovoltage.

27. The method of claim 18, wherein correcting the frequency dependence of the surface photovoltages includes recalculating the surface photovoltages relative to a single modulation frequency.

28. The method of claim 27, wherein the single modulation frequency corresponds to one of the modulation frequencies of the light.

29. The method of claim 16, wherein the at least two surface photovoltages are simultaneously detected by an electrode placed in proximity to the illuminated site on the semiconductor.

30. The method of claim 29, wherein the detected surface photovoltages are separated by monitoring the amplitudes of surface photovoltages at each of the different modulation frequencies.

31. The method of claim 30 further including monitoring the phases of the detected surface photovoltages at each of the different modulation frequencies.

32. The method of claim 16, wherein each of the wavelengths in the light generates excess carriers in the semiconductor and induces the surface photovoltage.

33. The method of claim 31, wherein each of the individual wavelengths in the light penetrates into the semiconductor to different penetrating depths beneath the surface of the semiconductor.

* * * * *